United States Patent
Liu

(10) Patent No.: US 6,333,234 B1
(45) Date of Patent: Dec. 25, 2001

(54) METHOD FOR MAKING A HVMOS TRANSISTOR

(75) Inventor: Chang-Miao Liu, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/803,886

(22) Filed: Mar. 13, 2001

(51) Int. Cl.⁷ .................................................. H01L 21/336
(52) U.S. Cl. ........................ 438/307; 438/151; 438/298
(58) Field of Search ................................ 438/135, 151, 438/155, 163, 286, 298, 306, 307

(56) References Cited

U.S. PATENT DOCUMENTS

| | | | |
|---|---|---|---|
| 5,770,880 | * 6/1998 | Woodbury et al. | 438/298 |
| 5,932,897 | * 8/1999 | Kawaguchi et al. | 438/307 |
| 6,118,152 | * 9/2000 | Yamaguchi et al. | 438/151 |
| 6,207,518 | * 3/2001 | Akaishi et al. | 438/307 |

FOREIGN PATENT DOCUMENTS 2000-236092 * 8/2000 (JP).

* cited by examiner

*Primary Examiner*—Chandra Chaudhari
(74) *Attorney, Agent, or Firm*—Winston Hsu

(57) ABSTRACT

The present invention provides a method for making a HVMOS transistor on a SOI substrate. The method according to the present invention involves forming a plurality of shallow trench isolations (STI) and at least one active area isolated by each shallow trench isolation on the SOI substrate. Then, two unneighboring field oxide layers and a gate are formed on the surface of the active area, with a portion of the gate covering the two field oxide layers. Thereafter, two double diffuse drains(DDD) are formed on the surface of the active area not covered by the gate and the two field oxide layers. Finally, a drift region of the HVMOS transistor is formed at the bottom of the two field oxide layers.

18 Claims, 6 Drawing Sheets

METHOD FOR MAKING A HVMOS TRANSISTOR

BACKGROUND OF THE INVENTION

1. Field of the Invention

The present invention provides a method for making a high-voltage metal-oxide-semiconductor (HVMOS) transistor, especially a high-voltage metal-oxide-semiconductor transistor with high junction breakdown voltage and decreased snap-back phenomenom.

2. Description of the Prior Art

High-voltage metal-oxide-semiconductor (HVMOS) transistors are widely used in many electrical devices, such as CPU power supplies, power management systems, AC/DC converters, etc.

Since the HVMOS transistors are commonly used under high operational voltage, the resulting high electric field leads to the incurrence of numerous hot electrons around the junction of the channel and drain. These hot electrons affect covalent electrons around the drain by causing many electron-hole pairs through the lifting of the electrons around the drain to conductive bands. Most of the ionized electrons resulting from the hot electrons move to the drain and increase the drain current $I_d$ and a small portion of the ionized electrons are injected into and become trapped in the gate oxide layer to cause a shift in gate threshold voltage. On the other hand, the holes caused by hot electrons flow to the substrate and produce a substrate current $I_{sub}$. As the operational voltage increases, the quantity of electron-hole pairs correspondingly increases to lead to the phenomenon known as carrier multiplication.

Please refer to FIG. 1. FIG. 1 is cross-sectional diagram of an HVMOS transistor 30 according to the prior art. As shown in FIG. 1, the HVMOS transistor 30 is manufactured on a semiconductor wafer 10. The semiconductor wafer 10 comprises a P-type silicon substrate 11 and a P-type epitaxial layer 12 formed on the surface of the P-type silicon substrate 11. The HVMOS transistor 30 comprises a P-well region 21, an N-type source 22 formed within the P-well region 21, an N-type drain 24 formed in the P-type epitaxial layer 12, and a gate 14.

When the above-mentioned substrate current $I_{sub}$ flows through the silicon substrate 11, the native resistance $R_{sub}$ of the silicon substrate 11 itself induces an inductive voltage ($V_b$). If the inductive voltage $V_b$ is large enough, a forward bias between the silicon substrate 11 and the source 22 will be produced and simultaneously form what is termed as a parasitic bipolar junction transistor 40. When the parasitic bipolar junction transistor 40 is turned on, current flow from the drain 24 to the source 22 abruptly increases to cause the snap-back phenomenon and produce a defective HVMOS 30. The smallest drain voltage to cause the snap-back phenomenon is termed snapback voltage. Also, the channel conductance of the HVMOS 30 of the prior art is not sufficient so that inferior current drifting occurs to easily result in the snap-back phenomenon.

However, in some HVMOS transistors, a double diffuse drain (DDD) has been extensively applied to the source/drain (S/D) structure in order to provide a higher breakdown voltage. As well, the double diffuse drain helps to suppress the hot electron effect caused by the short channel effect of the MOS transistor to further avoid electrical breakdown of the source/drain under high operational voltage. However, the above-mentioned snapback voltage degradation problem caused by the substrate current still cannot be thoroughly resolved. Therefore, importance lies in the resolution of the above-mentioned problem as well as to greatly increase the junction breakdown voltage.

SUMMARY OF THE INVENTION

It is therefore a primary objective of the present invention to provide a structure and method for making a HVMOS transistor with both a high junction breakdown voltage and a high snapback voltage.

In the preferred embodiment of the present invention, a shallow trench isolation(STI) process is performed on a silicon-on-insulator(SOI) substrate in order to form a plurality of shallow trench isolations and at least one active area isolated by each STI on the SOI substrate. Then, two unneighboring field oxides (FOX) are formed on the surface of the active area, as well as a gate formed on the surface of the active area between the two field oxides with a portion of the gate covering the two field oxides. Thereafter, a first ion implantation process is performed in order to form two first ion implantation areas on the surface of the active area not covered by the gate and the two field oxides. Then, a second ion implantation process is performed in order to form two second ion implantation areas on the surface of the active area not covered by the gate and the two field oxides. Finally, a third ion implantation process is performed in order to form two third ion implantation areas at the bottom of the two field oxides. The two first ion implantation areas and the two second ion implantation areas are used for forming two double diffused drains (DDD), which are taken as the source and drain of the HVMOS transistor, and the two third ion implantation areas are used for the drift region of the HVMOS transistor.

It is an advantage of the present invention that in the method for making the HVMOS transistor, the STI functions as a partition for each HVMOS transistor so that the junction breakdown voltage increases and the size of the whole HVMOS transistor decreases. Concurrently, the insulation layer in the SOI substrate isolates the silicon substrate from the single crystal layer, and the substrate current can be thus reduced to avoid the occurrence of the snap-back phenomenon and increase the snapback voltage.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
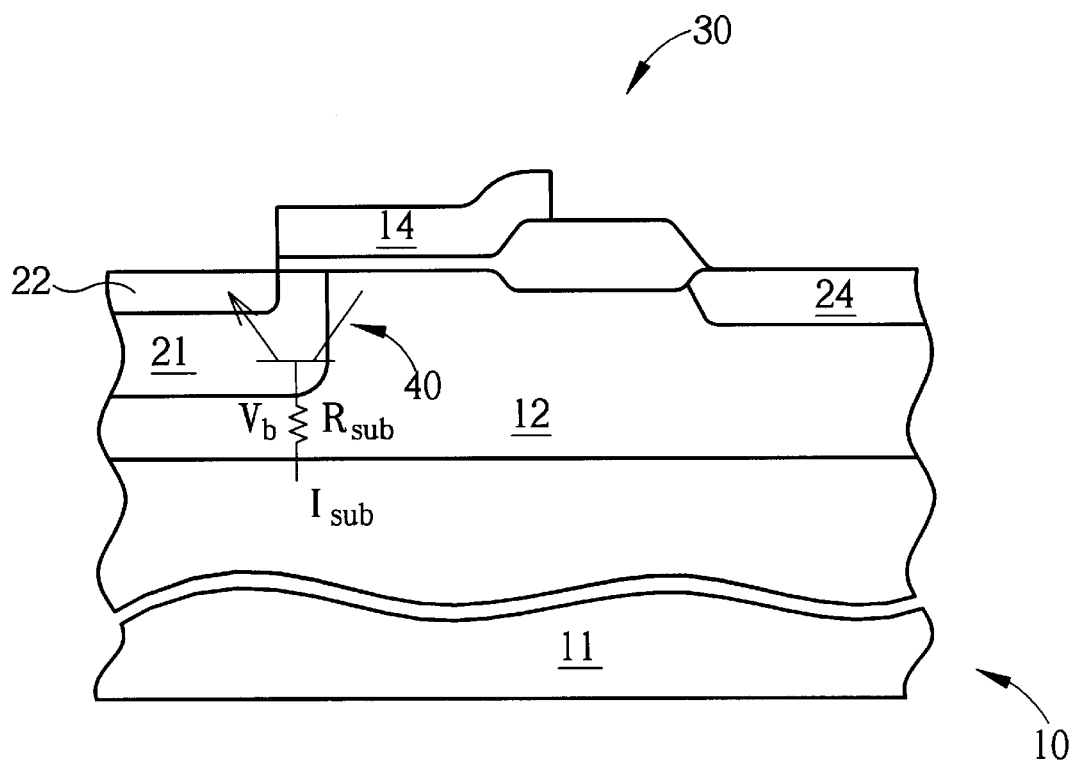
FIG. 1 is the cross-sectional schematic diagram of the HVMOS transistor according to the prior art method.
Figure 2:
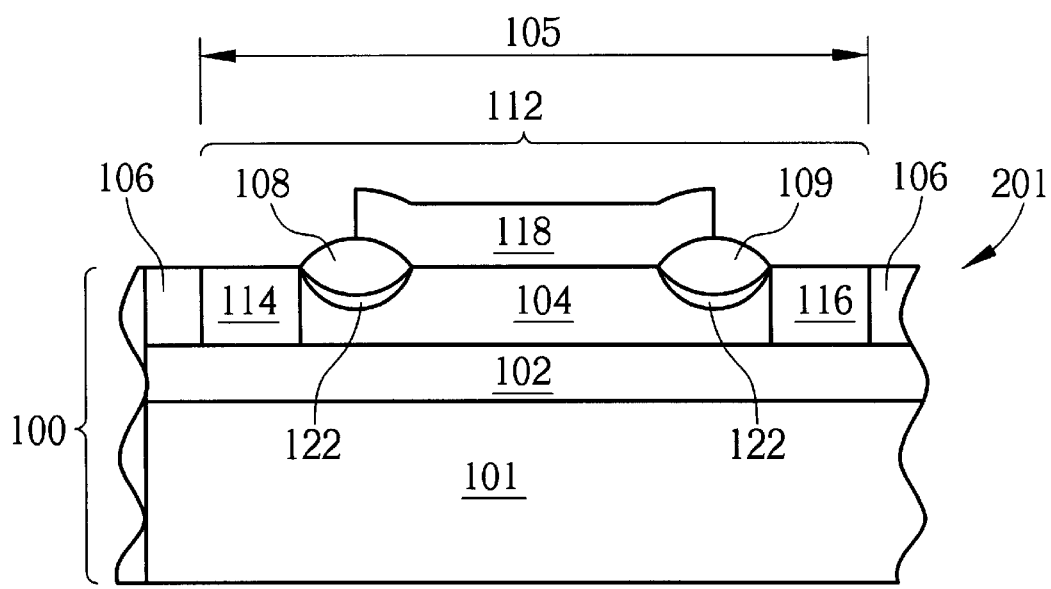
FIG. 2 is the cross-sectional schematic diagram of the HVMOS transistor made on a SOI substrate according to the present invention.

Please refer to FIG. 2 of the cross-sectional schematic diagram of the HVMOS transistor 201 made on a SOI substrate 100 according to the present invention. As shown in FIG. 2, the SOI substrate 100 comprises a silicon substrate 101 of a first conductive type, an insulation layer 102 formed on the silicon substrate 101, and a single crystal layer 104 of a first conductive type formed on the insulation layer 102. The single crystal layer 104 comprises a plurality of shallow trench isolations 106 filled with dielectric material, whereby every two STIs 106 define an active area 105 and the active area comprising two unneighboring field oxides 108,109.

The HVMOS transistor 201 comprises a first well region 112 of a first conductive type formed on the surface of the single crystal 104. A source region 114 and a drain region 116 both of a second conductive type are formed in the single crystal layer 104. A gate 118 is formed on the surface of the single crystal layer 104 between the source region 114 and the drain region 116 with a portion covering the two field oxides 108,109. A drift region 122 of a second conductive type is formed at the bottom of the two field oxides 108,109. The first and second conductive types are opposite to each other.

In the preferred embodiment of the present invention, the first conductive type is a P type and the second conductive type is a N type in order to produce the N type HVMOS 201. Oppositely, if the HVMOS transistor 201 is P type, the first conductive type is N type and the second conductive type is P type.

Figure 3:
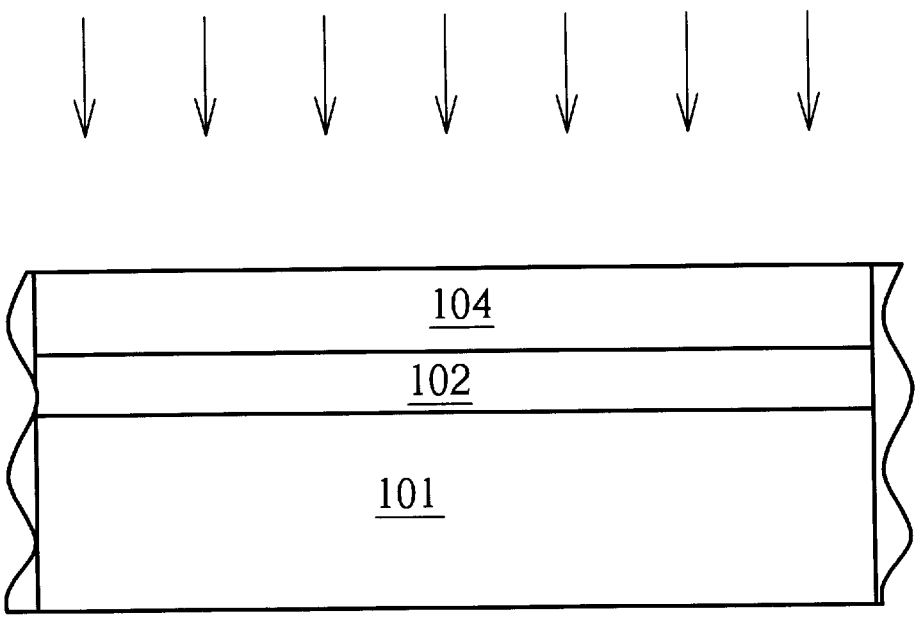
FIGS. 3 to 10 are the schematic diagrams of manufacturing the HVMOS transistor according to the present invention method.

Please refer to FIG. 3 to FIG. 10 of the schematic diagrams of manufacturing the HVMOS transistor 201 according to the present invention method. The HVMOS transistor 201 is made on a SOI substrate 100, which is fabricated using a general method such as by a separation by implanted oxygen (SIMOX) process to produce a silicon dioxide ($SiO_2$) insulation layer between the surface silicon and the bulk silicon to function in isolation. Then, an anneal process is performed on the silicon substrate 101 at a temperature environment greater than 1300° C. for several hours. The anneal process heats the silicon atoms on the surface of the silicon substrate 101, so as to recover the single crystal layer 104 destroyed by the oxygen ion implantation. The single crystal layer 104 thereby has a low defect concentration due to the lattice site rearrangement of the vibrating silicon atoms. Simultaneously, the implanted oxygen ion and silicon combine to form a silicon dioxide insulation layer 102 and form the cross-sectional result of the SOI substrate 100 as shown in FIG. 3.

Figure 4:
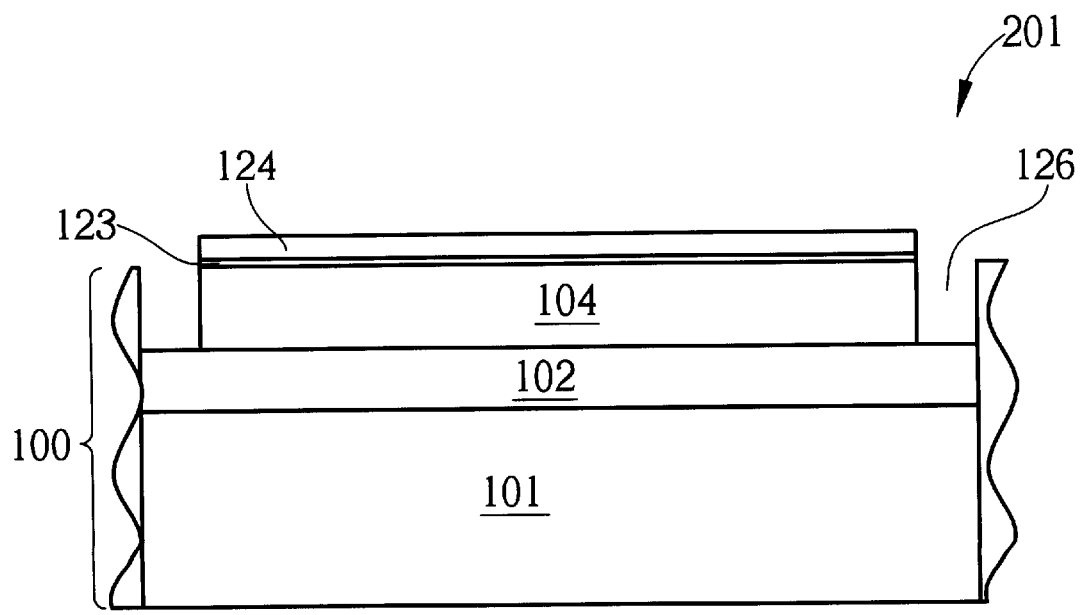

As shown in FIG. 4, a general shallow trench isolation process is performed. Firstly, a pad oxide layer 123 and a silicon nitride layer 124 are formed, respectively, on the single crystal layer 104. Then, a first photolithographic process is performed to form a first photoresist layer(not indicated) on the surface of the single crystal layer 104 in order to define two shallow trench 126 patterns. Then, a first etching process is used in order to remove the silicon nitride layer 124 not covered by the first photoresist layer (not indicated), followed by the removal of the first photoresist layer(not indicated). The remaining silicon nitride layer 124 is then used as a hard mask to perform an etching process to remove the single crystal layer 104 not covered by the silicon nitride layer 124 down to the surface of the insulation layer 102 to complete the shallow trench 126. Next, the first photoresist layer is removed.

Figure 5:
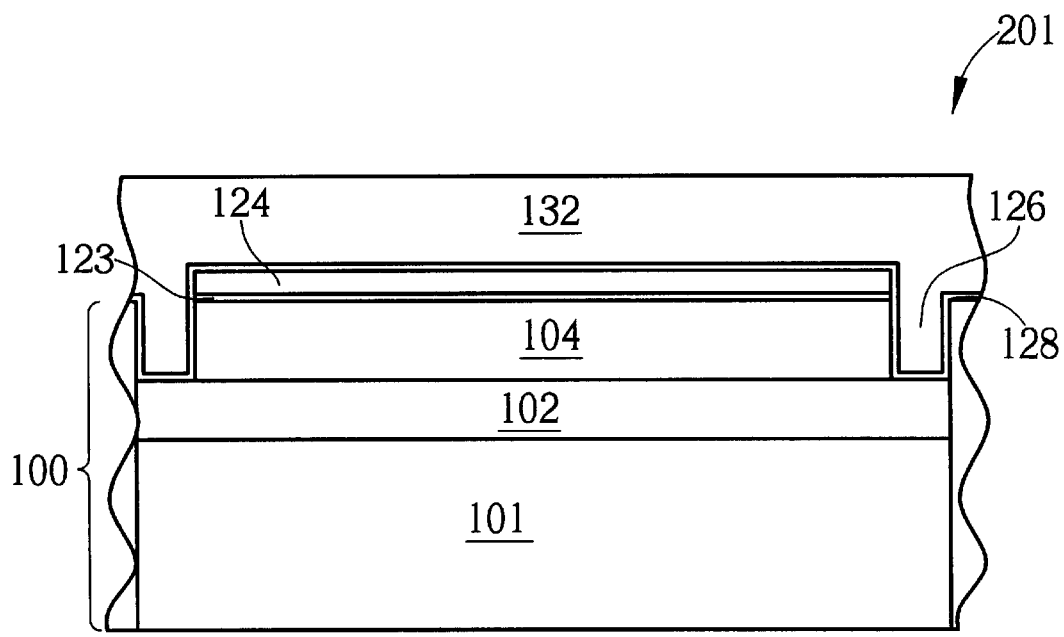

As shown in FIG. 5, an oxidation process is performed to form a silicon dioxide layer 128 on the surface of the silicon nitride layer 125 and covering the bottom and side walls of the trench 126. Then, at least one dielectric layer 132 is formed on the surface of the dielectric layer 128, and filling in the shallow trench 126. Thereafter, a chemical mechanical polishing (CMP) process is performed to align the surface of the dielectric layer 132 in the shallow trench 126 with that of the silicon nitride layer 124, followed by a wet etching process to remove both the silicon nitride layer 124 and the pad oxide layer 123 to complete the process of making the shallow trench isolation 106.

Figure 6:
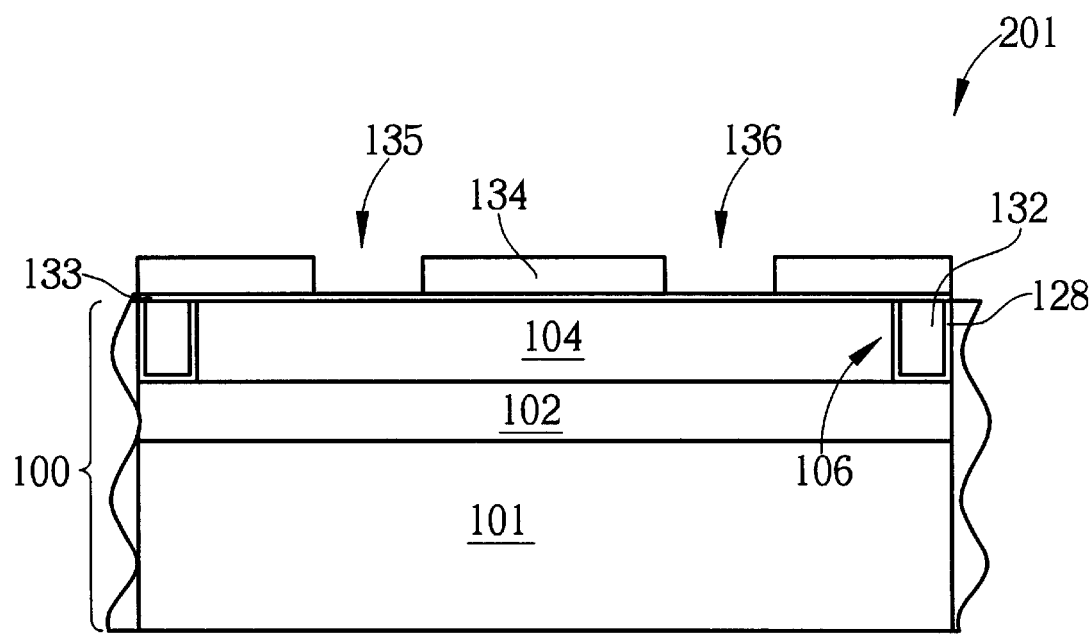

As shown in FIG. 6, after performing a series of cleaning and drying processes to the SOI substrate 100, a pad oxide layer 133 with a thickness of 65 to 400 Å is formed on the surface of both the single crystal layer 104 and the shallow trench isolation 106 using thermal oxidation. Thereafter, a low pressure chemical vapor deposition (LPCVD) process is performed to deposit a silicon nitride layer 134 atop the pad oxide layer 133. The low pressure chemical vapor deposition process uses dichlorosilane($SiH_2Cl_4$) and ammonia ($NH_3$) as reactive gases. The chemical reaction is proceeded in a chamber with a reaction temperature between 700 to 800° C. and a reaction pressure between 0.1 to 1 torr. The pad oxide layer 133 is used as the sacrificial oxide layer in the following ion implantation process to protect the silicon structure on the surface of the single crystal layer 104 from the following high energy implantation process. Also, it can be the buffer layer between the surface silicon and the high stress silicon nitride layer 134.

Then, a second photolithographic process is performed in order to form a second photoresist layer (not indicated) on the surface of the single crystal layer 104. By applying the second photoresist layer (not indicated) and a second etching process, two unneighboring field oxide regions 135, 136 in the silicon nitride layer 134 are defined. Next, the second photoresist layer (not indicated) is removed.

Figure 7:
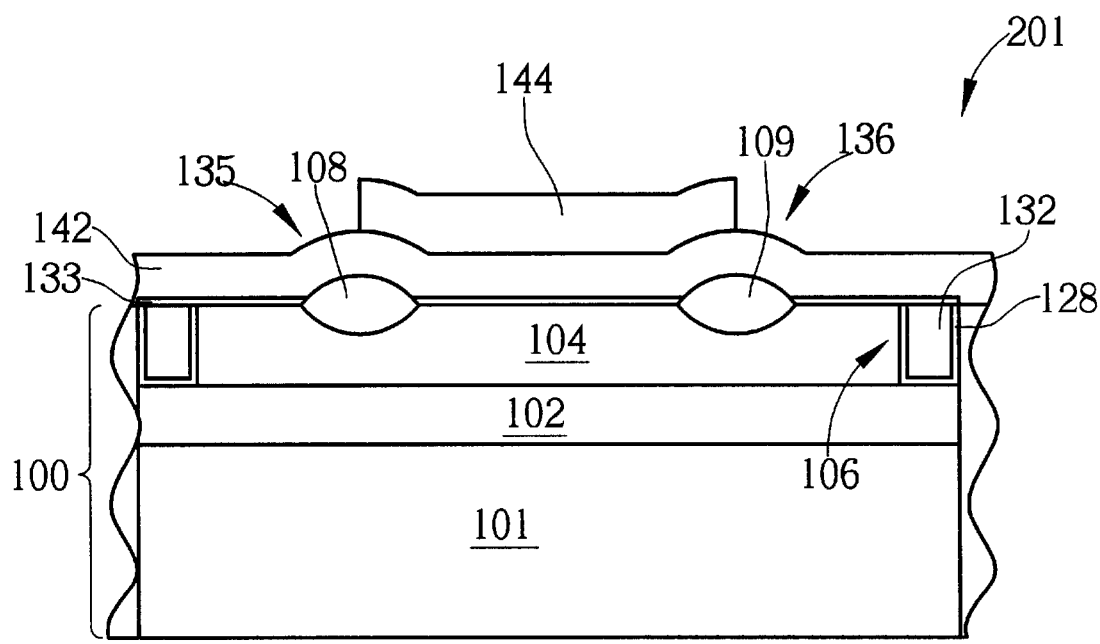

As shown in FIG. 7, a thermal oxidation process is performed in order to form two field oxide layers (FOX) 108,109 in the pad oxide layer 133 of the two unneighboring field oxide regions 135, 136. Then, a hot phosphoric acid solution is used to remove the remaining silicon nitride layer 134. Thereafter, a polysilicon layer 142 is formed on the single crystal layer 104, and covering the shallow trench isolation 106 and field oxide layers 108,109. Then, a third photolithographic process is performed using a third photoresist layer 144 to define a gate 118 pattern of the HVMOS transistor 201, with a portion of the gate 118 covering the field oxide layers 108,109. Thereafter, a third etching process is used to remove the polysilicon layer 142 not covered by the third photoresist layer 144 in order to form a gate 118 of the HVMOS transistor 201, with a portion of the gate 118 covering the field oxide layers 108,109.

Figure 8:
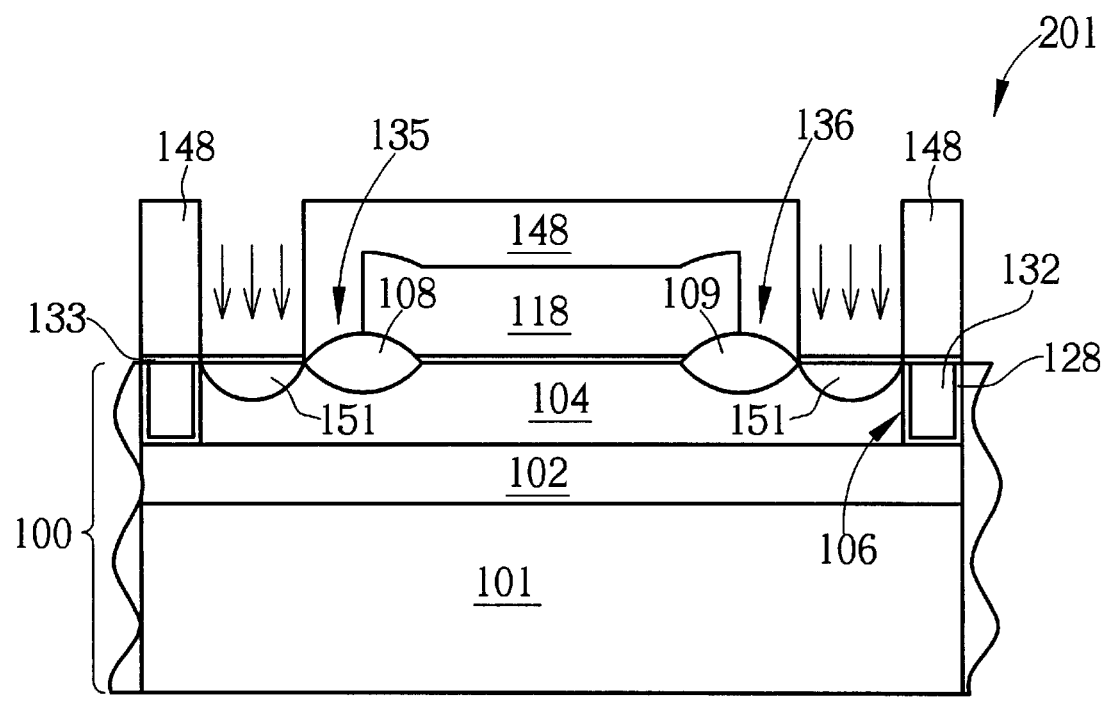

As shown in FIG. 8, a fourth photolithographic process is performed using a fourth photoresist layer 148 which covers the shallow trench isolation 106, the gate 118 and the field oxide layers 108,109. Next, an ion implantation process is performed to form two first ion implantation areas 151. The first ion implantation process uses phosphorous ion($p^{31}$) as a dopant, with a dosage of approximately $1.0*10^{13}$ atoms/$cm^2$. Thereafter, the fourth photoresist layer 148 is removed and a high temperature driving process is used, with a driving-in temperature of approximately 1000° C., in order to drive the $p^{31}$ ions into a specific depth in the single crystal layer 104. As a result, the distribution of $p^{31}$ ions is more uniform and forms the required junction profile, in other words, $N^-$ dopant areas 153 are formed with a recovered lattice structure on the surface of the SOI substrate 100 after the bombardment of the high energy ions.

Figure 9:
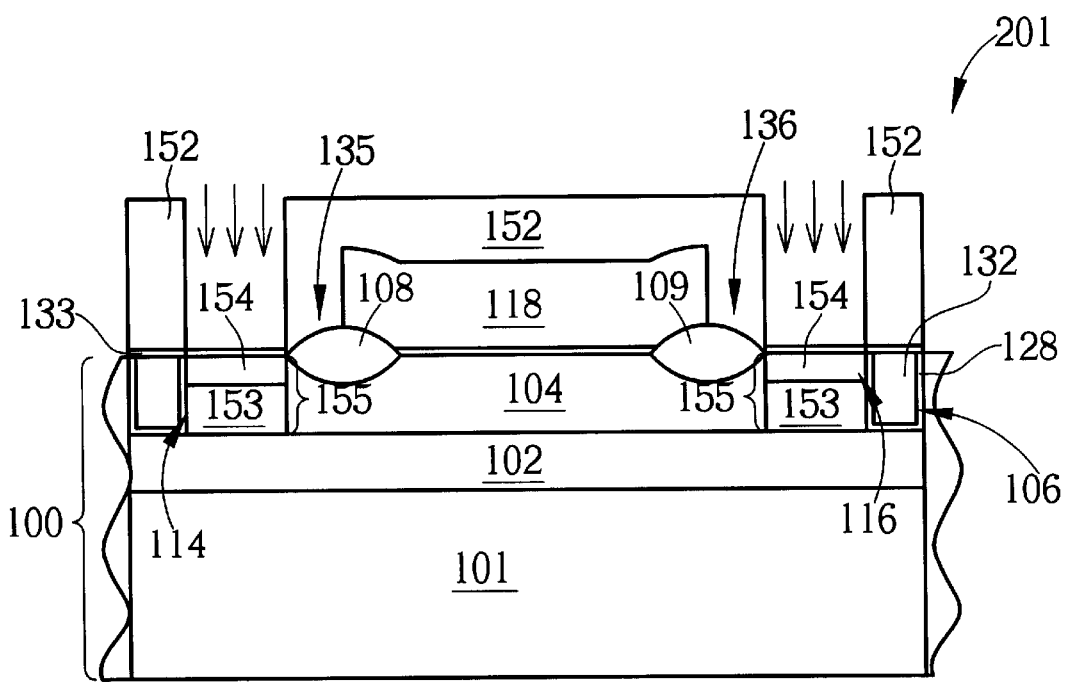

As shown in FIG. 9, a fifth photolithographic process is performed using a fifth photoresist layer 152 which covers the shallow trench isolation 106, the gate 146 and the field oxide layers 108,109. Then, an ion implantation process is performed to form two second ion implantation areas (not indicated). The ion implantation process uses arsenic ion (As$^{15}$) as a dopant with a dosage of approximately $1.0*10^{15}$ atoms/cm$^2$. Thereafter, the fifth photoresist layer 152 is removed and a second high temperature driving-in process is used with a driving-in temperature of about 1000° C. in order to recover the lattice structure on the surface of the SOI substrate 100 after the bombardment of the high energy ions. As well, the As$^{15}$ ions are driven into a specific depth in the single crystal layer 104 to form a higher concentrated N$^+$ dopant area 154. The N$^-$ dopant area 153 and the N$^+$ dopant area 154 form a double diffused drain(DDD) 155 structure and functions as a source 114 and drain 116 of the HVMOS transistor 201. Also, the above-mentioned two high temperature driving-in processes can be combined together as one high temperature driving-in process in order to reduce the thermal budget.

Figure 10:
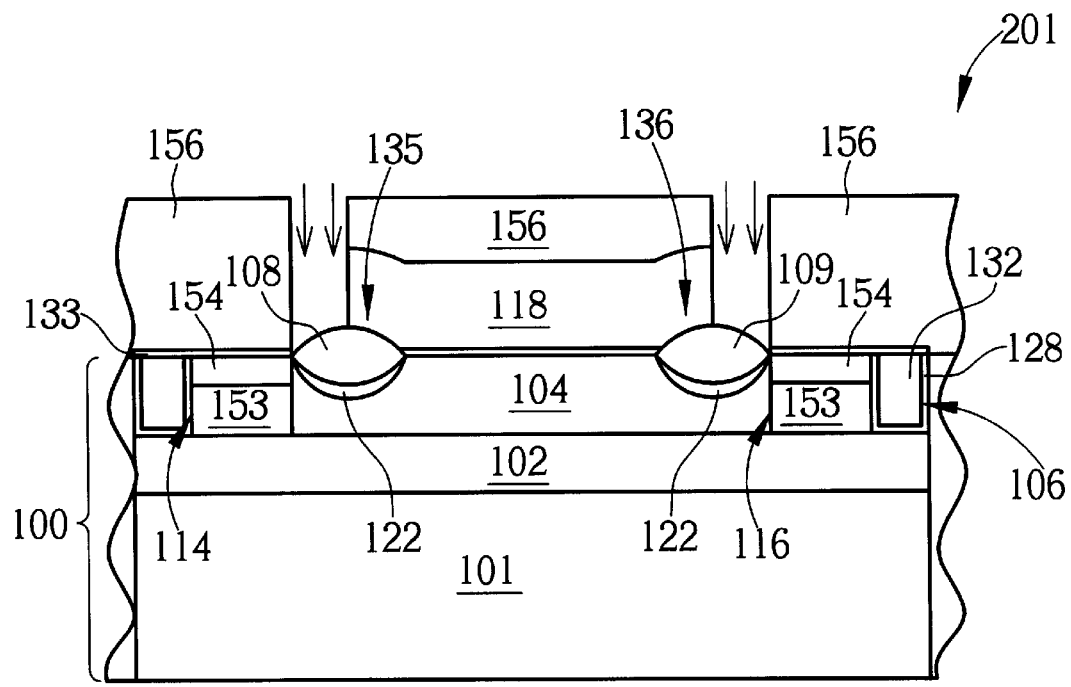

As shown in FIG. 10, a sixth photolithographic process is performed using a sixth photoresist layer 156 which covers the shallow trench isolation 106, the source/drain 114,116 and the gate 118. Then, a third ion implantation process is performed on the field oxide layers 108,109 using phosphorous (p$^{31}$) as a dopant and with a dosage of approximately $1.0*10^{13}$ atoms/cm$^2$. The sixth photoresist layer 156 is then removed and a high temperature driving-in process is performed in order to form a drift region 122 at the bottom of the two field oxide layers 108, 109. Finally, a contact process is performed on the source/drain 114,116 to obtain the required characteristic of each semiconductor product and complete the manufacturing of the HVMOS transistor 201.

In the above-mentioned preferred embodiment of the present invention, the field oxide layers 108, 109 can be replaced by two dielectric layers or two shallow trenches, with a portion of the gate 118 covering the two dielectric layers or the two shallow trench isolations. If two shallow trench isolations are used instead of the field oxide layers 108,109, the drift area 122 at the bottom of the two field oxide layers 108,109 can be formed by an ion implantation process or a high concentration ion diffusion process.

Figure 11:
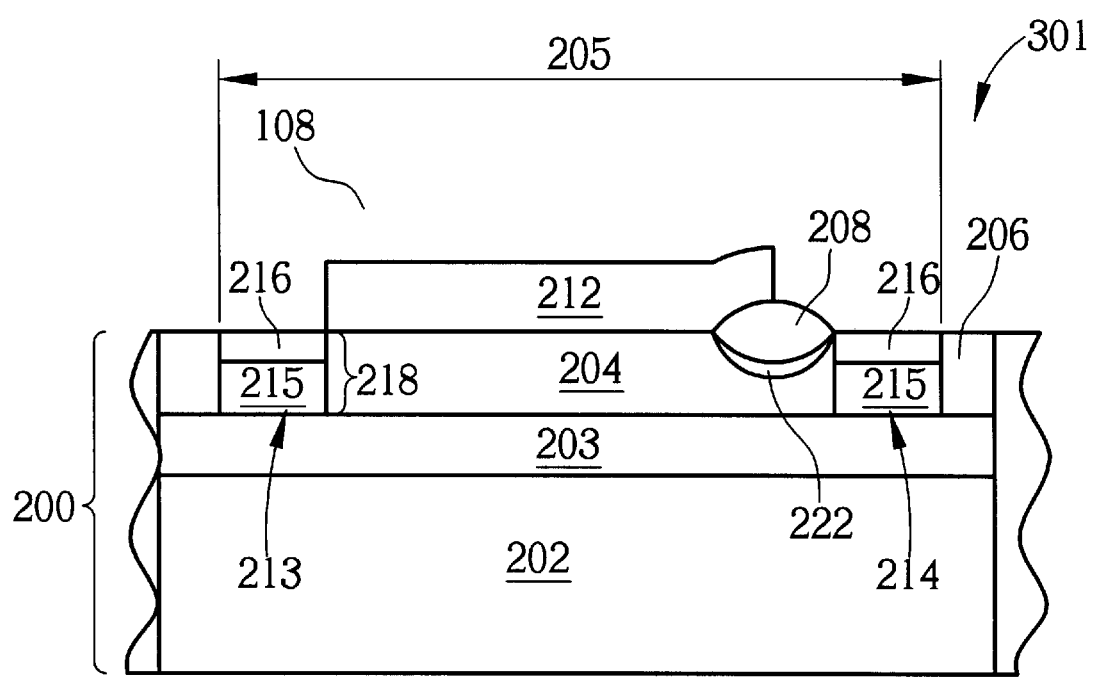
FIG. 11 is the structural schematic diagram of the N type lateral diffused metal-oxide-semiconductor transistor made on a SOI substrate according to the present invention.

The method for forming the dopant area with a DDD structure in the present invention can be applied not only to the HVMOS transistor 201, but also to a non-symmetrical lateral diffused metal-oxide semiconductor(LD, MOS) transistor 301. As shown in FIG. 11, FIG. 11 is the structural schematic diagram of the N type lateral diffused metal-oxide-semiconductor transistor 301 according to the present invention. The LDMOS 301 is made on a SOI substrate 200. The SOI substrate 200 comprises a silicon substrate 202, an insulation layer 203 and a single crystal layer 204.

First, a shallow trench isolation(STI) process is performed in order to form a plurality of shallow trench isolations 206 in the single crystal layer 204, with the shallow trench isolation 206 connecting with the insulation layer 203. Then, at least one active area 205 is formed and isolated by each shallow trench isolation 206 in the single crystal layer 204. Thereafter, a field oxide layer 208 and a gate 212 is formed on the surface of the active area 205, with a portion of the gate 212 covering the field oxide layer 208.

A first ion implantation process is then performed in order to form two first ion implantation areas at the pre-defined source/drain 213,214 site on the surface of the active area 205. Then, a second ion implantation process is applied to form two second ion implantation areas at the pre-defined source/drain 213,214 site on the surface of the active area 205. A high temperature driving-in process is then used to simultaneously form a lightly concentrated dopant area 215 and a highly concentrated dopant area 216 in the single crystal layer 204 in order to form a double diffused drain 218 structure, functioning as a source 213 and drain 214 of the LDMOS transistor 301. Finally, a third ion implantation process is used to form a third ion implantation area at the bottom of the field oxide layer 208, and is taken as the drift area 222 of the LDMOS transistor 301.

It is therefore the method according to the present invention for making a HVMOS transistor 201 to apply a shallow trench isolation 106 functioning as a partition of each single HVMOS transistor 201. As a result, the junction breakdown voltage is lifted. As well, the dimension of the HVMOS transistor 201 is decreased since the dimension required by the shallow trench isolation 106 is less than that required by other methods (e.g. field oxide). Furthermore, if a P type LDMOS transistor(not indicated) is to be made on a SOI substrate 200, or both a P type LVMOS transistor(not indicated) and a P type HVMOS transistor(not indicated) are to be simultaneously made on a SOI substrate 200, the process steps need not be changed. The only required change is to change the P type silicon substrate to the N type silicon substrate and form a plurality of N wells in the P type silicon substrate, and to change the N type ions adapted in the first, second and third ion implantation processes to P type ions.

In contrast to the prior method of forming the HVMOS, the HVMOS 201 according to the present invention is made on a SOI substrate 100. Thus, the insulation layer 102 in the SOI substrate 100 can efficiently isolate the silicon substrate and the single crystal layer, to eliminate the substrate current path and decrease the substrate current. Furthermore, the phenomenon of the parasitic bipolar junction transistor is decreased. Therefore, the I-V curve of the HVMOS 201 according to the present invention will have a smooth saturation region without the existence of kinks. Also, the HVMOS transistor 201 according to the present invention avoids the occurrence of the snap-back breakdown, so that the snapback breakdown voltage greatly increases to further improve the high reliability performance of the HVMOS transistor 201.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making a symmetrical high voltage metal oxide semiconductor (HVMOS) on a semiconductor wafer, the method comprising:

providing a silicon-on-insulator (SOI) substrate;

performing a shallow trench isolation(STI) process so as to form a plurality of shallow trench isolations and to form at least one active area isolated by each shallow trench isolation on the surface of the SOI substrate;

forming two unnneighboring field oxides (FOX) on the surface of the active area;

forming a gate between the two field oxides on the surface of the active area, with a portion of the gate covering the two field oxides;

performing a first ion implantation process so as to form two first ion implantation areas on the surface of the active area not covered by the gate and the field oxide;

performing a second ion implantation process so as to form two second ion implantation areas on the surface of the active area not covered by the gate and the field oxide;and performing a third ion implantation process so as to form two third ion implantation areas at the bottom of the two field oxides;

wherein the two first ion implantation areas and the two second ion implantation areas are used for forming two double diffuse drains (DDD) respectively, to function as a source and drain of the HVMOS, and two third ion implantation areas are used for a drift area of the HVMOS.

2. The method of claim 1 wherein the silicon-on-insulator substrate comprises a silicon substrate, an isolation layer positioned on the silicon substrate and a single crystal silicon layer positioned on the isolation layer.

3. The method of claim 2 wherein the single crystal layer further comprises a well, and the active area is formed in the well.

4. The method of claim 1 wherein the gate is a doped polysilicon layer.

5. The method of claim 1 wherein a high temperature driving process is used after each ion implantation process for activating the dopants in each of the ion implantation areas.

6. A method for making a symmetrical high voltage metal oxide semiconductor (HVMOS) on a semiconductor wafer, the method comprising:

providing a silicon-on-insulator (SOI) substrate, and the silicon-on-isolator substrate comprises a silicon substrate, an isolation layer positioned on the silicon substrate and a single crystal layer positioned on the isolation layer;

performing a shallow trench isolation (STI) process so as to form a plurality of shallow trench isolations, the plurality of shallow trench isolations comprises a first shallow trench isolation connected to the isolation layer so as to isolate an active area, and two second shallow trench isolations not neighboring each other and not connected to the isolation layer formed on the surface of the active area;

forming a gate between the two second shallow trench isolations on the surface of the active area;

performing a first ion implantation process so as to form two first ion implantation areas on the surface of the active area not covered by the gate and the two second shallow trench isolations; and performing a second ion implantation process so as to form two second ion implantation areas on the surface of the active area not covered by the gate and the second shallow trench isolation;

wherein the two first ion implantation areas and the two second ion implantation areas are used for forming two double diffuse drains (DDD), respectively, and functioning as a source and drain of the HVMOS.

7. The method of claim 6 wherein the single crystal layer adjacent to the two second shallow trench isolations further comprises a third ion implantation area taken as a drift region of the HVMOS.

8. The method of claim 7 wherein the third ion implantation area is formed with a third ion implantation process.

9. The method of claim 7 wherein the third ion implantation area is formed with an ion diffusion method.

10. The method of claim 6 wherein the single crystal layer further comprises a well and the active area is formed in the well.

11. The method of claim 6 wherein the gate is a doped polysilicon layer.

12. The method of claim 6 wherein a high temperature driving process is performed after each ion implantation process for activating the dopants in each of the ion implantation areas.

13. A method for making a symmetrical high voltage metal oxide semiconductor (HVMOS) on a semiconductor wafer, the method comprising:

providing a silicon-on-insulator (SOI) substrate;

performing a shallow trench isolation (STI) process so as to form a plurality of shallow trench isolations and to form at least one active area isolated by each shallow trench isolation on the surface of the SOI substrate;

forming two unneighboring dielectric layers on the surface of the active area;

forming a gate between the two dielectric layers on the surface of the active area, with a portion of the gate covering the two dielectric layers;

performing a first ion implantation process so as to form two first ion implantation areas on the surface of the active area not covered by the gate and the two dielectric layers;

performing a second ion implantation process so as to form two second ion implantation areas on the surface of the active area not covered by the gate and the dielectric layer; and performing a third ion implantation process so as to form two third ion implantation areas at the bottom of the two dielectric layers;

wherein the two first ion implantation areas and the two the second ion implantation areas are used for forming two double diffuse drains(DDD), respectively, functioning as a source and drain of the HVMOS, and two third ion implantation areas are used for a drift area of the HVMOS.

14. The method of claim 13 wherein the silicon-on-insulator substrate comprises a silicon substrate, an isolation layer positioned on the silicon substrate and a single crystal silicon layer positioned on the isolation layer.

15. The method of claim 14 wherein the single crystal layer further comprises a well, and the active area is formed in the well.

16. The method of claim 13 wherein the gate is a doped polysilicon layer.

17. The method of claim 13 wherein a high temperature driving process is performed after each ion implantation process for activating the dopants in each of the ion implantation areas.

18. The method of claim 13 wherein the dielectric layer comprises a silicon oxide compound or a silicon nitride compound.

* * * * *